(12) United States Patent
Strittmatter et al.

(10) Patent No.: US 8,179,027 B2
(45) Date of Patent: May 15, 2012

(54) COATING FOR ACTUATOR AND METHOD OF APPLYING COATING

(75) Inventors: Patrick Clement Strittmatter, Frisco, TX (US); Richard James Brogle, Plano, TX (US); Ian Paul Barta, Guelph (CA); Todd Robert Paleczny, Heidelberg (CA); Arnett Ryan Weber, Burlington (CA); Kurt Johannes Gerd Mehlhorn, Brampton (CA)

(73) Assignee: Research In Motion Limited, Waterloo, Ontario (CA)

( * ) Notice: Subject to any disclaimer, the term of this patent is extended or adjusted under 35 U.S.C. 154(b) by 287 days.

(21) Appl. No.: 12/578,257

(22) Filed: Oct. 13, 2009

(65) Prior Publication Data

US 2010/0156245 A1 Jun. 24, 2010

(51) Int. Cl.
*H01L 41/053* (2006.01)
(52) U.S. Cl. ......... 310/369; 310/338; 310/339; 310/340
(58) Field of Classification Search ............ 310/369, 310/338, 339, 340
See application file for complete search history.

(56) References Cited

U.S. PATENT DOCUMENTS

| | | | |
|---|---|---|---|
| 4,083,209 A * | 4/1978 | Sloan, Jr. ................. | 70/165 |
| 6,359,758 B1 | 3/2002 | Boutaghou | |
| 6,429,846 B2 | 8/2002 | Rosenberg et al. | |
| 6,744,577 B1 | 6/2004 | Guo et al. | |
| 6,822,635 B2 | 11/2004 | Shahoian et al. | |
| 7,191,503 B2 * | 3/2007 | East ........................ | 29/25.35 |
| 7,205,978 B2 | 4/2007 | Poupyrev et al. | |
| 7,450,110 B2 | 11/2008 | Shahoian et al. | |
| 2002/0033795 A1 * | 3/2002 | Shahoian et al. ........... | 345/156 |
| 2005/0253643 A1 * | 11/2005 | Inokawa et al. ........... | 327/517 |
| 2006/0119586 A1 | 6/2006 | Grant et al. | |
| 2007/0015297 A1 | 6/2007 | Kim et al. | |
| 2007/0146348 A1 * | 6/2007 | Villain .................... | 345/173 |
| 2008/0060856 A1 | 3/2008 | Shahoian et al. | |
| 2008/0132313 A1 | 6/2008 | Rasmussen et al. | |

FOREIGN PATENT DOCUMENTS

EP 1566728 A1 8/2005

OTHER PUBLICATIONS

EP Extended Search Report, dated Apr. 7, 2010, EP Application No. 09173436.8, 6 pages.

* cited by examiner

*Primary Examiner* — Walter Benson
*Assistant Examiner* — Bryan Gordon
(74) *Attorney, Agent, or Firm* — Susan L. Lukasik; Research In Motion Limited

(57) ABSTRACT

A method includes applying a lip, comprised of a first material, along at least a portion of an actuator of an electronic device, and applying a coating, comprised of an elastic material, to cover a part of the actuator, the coating disposed to facilitate actuation of the actuator.

23 Claims, 5 Drawing Sheets

COATING FOR ACTUATOR AND METHOD OF APPLYING COATING

FIELD OF TECHNOLOGY

The present disclosure relates to electronic devices including but not limited to portable electronic devices having touch-sensitive displays and coating of an actuator in the electronic device.

BACKGROUND

Electronic devices, including portable electronic devices, have gained widespread use and may provide a variety of functions including, for example, telephonic, electronic messaging and other personal information manager (PIM) application functions. Portable electronic devices include several types of devices including mobile stations such as simple cellular telephones, smart telephones, wireless PDAs, and laptop computers with wireless 802.11 or Bluetooth capabilities.

Portable electronic devices such as PDAs or smart telephones are generally intended for handheld use and ease of portability. Smaller devices are generally desirable for portability. A touch-sensitive display, also known as a touch-screen display, is particularly useful on handheld devices, which are small and have limited space for user input and output. The information displayed on the touch-sensitive displays may be modified depending on the functions and operations being performed.

Improvements in devices with touch-sensitive displays are desirable.

DETAILED DESCRIPTION

Figure 1:
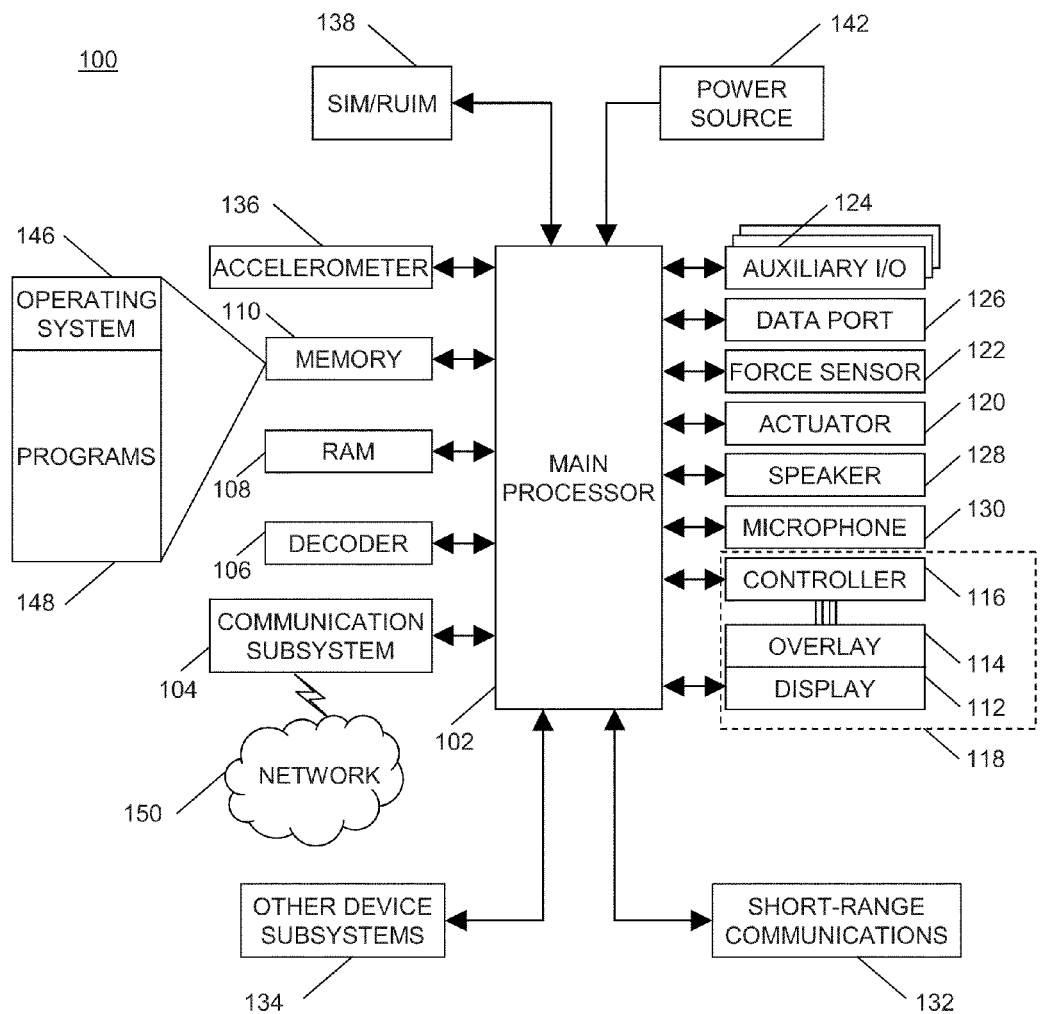
FIG. 1 is a block diagram of a portable electronic device in accordance with the present disclosure.

The following describes an electronic device and method including applying a lip, comprised of a first material, along at least a portion of an actuator of an electronic device, and applying a coating, comprised of an elastic material, to cover a part of the actuator, the coating disposed to facilitate actuation of the actuator.

For simplicity and clarity of illustration, reference numerals may be repeated among the figures to indicate corresponding or analogous elements. Numerous specific details are set forth to provide a thorough understanding of the embodiments described herein. The embodiments may be practiced without these specific details. In other instances, well-known methods, procedures, and components have not been described in detail so as not to obscure the embodiments described herein. The description is not to be considered as limited to the scope of the embodiments described herein.

The disclosure generally relates to an electronic device, which in the embodiments described herein is a portable electronic device. Examples of portable electronic devices include mobile, or handheld, wireless communication devices such as pagers, cellular phones, cellular smartphones, wireless organizers, personal digital assistants, wirelessly enabled notebook computers, and the like. The portable electronic device may also be a portable electronic device without wireless communication capabilities such as a handheld electronic game device, digital photograph album, digital camera, or other device.

A block diagram of an example of a portable electronic device 100 is shown in FIG. 1. The portable electronic device 100 includes multiple components, such as a processor 102 that controls the overall operation of the portable electronic device 100. Communication functions, including data and voice communications, are performed through a communication subsystem 104. Data received by the portable electronic device 100 is decompressed and decrypted by a decoder 106. The communication subsystem 104 receives messages from and sends messages to a wireless network 150. The wireless network 150 may be any type of wireless network, including, but not limited to, data wireless networks, voice wireless networks, and dual-mode networks that support both voice and data communications. A power source 142, such as one or more rechargeable batteries or a port to another power supply, powers the portable electronic device 100.

The processor 102 interacts with other devices, such as a Random Access Memory (RAM) 108, memory 110, a display 112 with a touch-sensitive overlay 114 operably connected to an electronic controller 116 that together comprise a touch-sensitive display 118, one or more actuators 120, one or more force sensors 122, an auxiliary input/output (I/O) subsystem 124, a data port 126, a speaker 128, a microphone 130, short-range communications 132 and other device subsystems 134. User-interaction with a graphical user interface is performed through the touch-sensitive overlay 114. The processor 102 interacts with the touch-sensitive overlay 114 via the electronic controller 116. Information, such as text, characters, symbols, images, icons, and other items that may be displayed or rendered on a portable electronic device, is displayed on the touch-sensitive display 118 via the processor 102. The processor 102 may also interact with an accelerometer 136 that may be utilized to detect direction of gravitational forces or gravity-induced reaction forces.

To identify a subscriber for network access, the portable electronic device 100 uses a Subscriber Identity Module or a Removable User Identity Module (SIM/RUIM) card 138 for communication with a network, such as the wireless network 150. Alternatively, user identification information may be programmed into the memory 110.

The portable electronic device 100 also includes an operating system 146 and software programs or components 148 that are executed by the processor 102 and are typically stored in a persistent, updatable store such as the memory 110. Additional applications or programs may be loaded onto the portable electronic device 100 through the wireless network 150, the auxiliary I/O subsystem 124, the data port 126, the short-range communications subsystem 132, or any other suitable subsystem 134.

A received signal such as a text message, an e-mail message, or web page download is processed by the communication subsystem 104 and input to the processor 102. The processor 102 processes the received signal for output to the display 112 and/or to the auxiliary I/O subsystem 124. A subscriber may generate data items, for example e-mail messages, which may be transmitted over the wireless network 150 through the communication subsystem 104. For voice communications, the overall operation of the portable electronic device 100 is similar. The speaker 128 outputs audible information converted from electrical signals, and the microphone 130 converts audible information into electrical signals for processing.

The touch-sensitive display 118 may be any suitable touch-sensitive display, such as a capacitive, resistive, infrared, or surface acoustic wave (SAW) touch-sensitive display, as known in the art. A capacitive touch-sensitive display includes the display 112 and a capacitive touch-sensitive overlay 114. The overlay 114 may be an assembly of multiple layers in a stack including, for example, a substrate, LCD display 112, a ground shield layer, a barrier layer, one or more capacitive touch sensor layers separated by a substrate or other barrier, and a cover. The capacitive touch sensor layers may be any suitable material, such as patterned indium tin oxide (ITO).

One or more touches, also known as touch contacts or touch events, may be detected by the touch-sensitive display 118 and processed by the controller 116, for example, to determine a location of a touch. Touch location data may include a single point of contact, such as a point at or near a center of the area of contact, or the entire area of contact for further processing. The location of a touch detected on the touch-sensitive display 118 may include x and y components, e.g., horizontal and vertical with respect to one's view of the touch-sensitive display 118, respectively. For example, the x component may be determined by a signal generated from one touch sensor layer, and the y component may be determined by a signal generated from another touch sensor layer. A signal is provided to the controller 116 in response to detection of a suitable object, such as a finger, thumb, or other items, for example, a stylus, pen, or other pointer, depending on the nature of the touch-sensitive display 118. More than one simultaneous location of contact may occur and be detected.

Figure 2A:
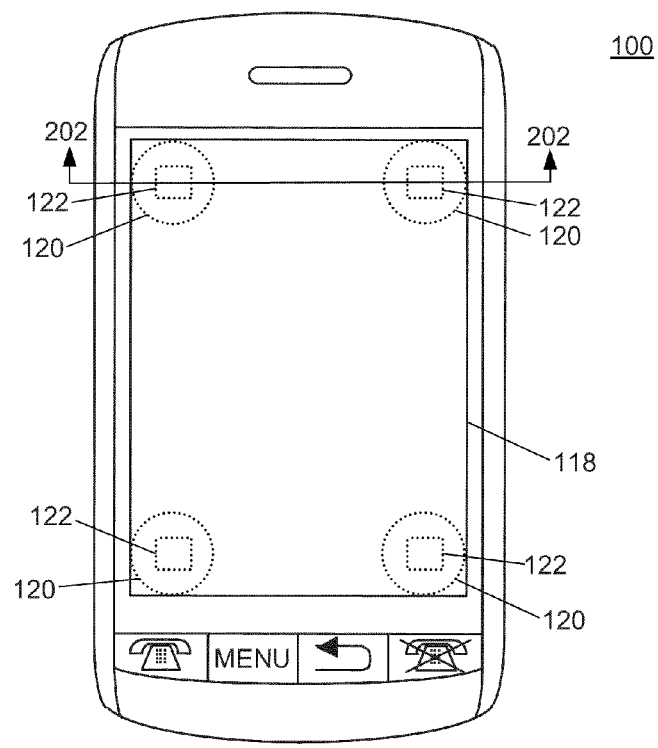
FIG. 2A is a front view of an example of a portable electronic device in accordance with the present disclosure.
Figure 2B:
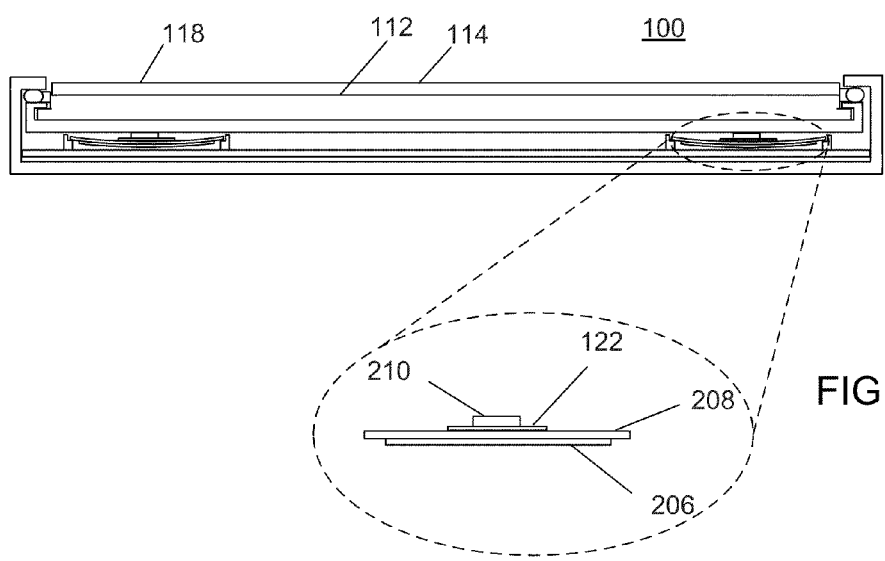
FIG. 2B is a sectional side view of the portable electronic device through the line 202 of FIG. 2 in accordance with the present disclosure.

The actuator 120 may comprise one or more piezoelectric (piezo) actuators that provide tactile feedback. FIG. 2A is front view of an example of a portable electronic device 100. In the example shown in FIG. 2A, the actuator 120 comprises four piezo actuators 120, each located near a corner of the touch-sensitive display 118. FIG. 2B is a sectional side view of the portable electronic device 100 through the line 202 of FIG. 2A. Each piezo actuator 120 is supported within the portable electronic device 100, such that contraction of the piezo actuators 120 applies a force against the touch-sensitive display 118, opposing a force externally applied to the display 118. Each piezo actuator 120 includes a piezoelectric device, such as a piezoelectric ceramic disk 206 adhered to a substrate 208, such as a metal substrate. An element 210 that is advantageously at least partially flexible and comprises, for example, hard rubber, may be located between the piezoelectric disk 206 and the touch-sensitive display 118. In the example shown in FIG. 2A, four optional force sensors 122 are utilized, with each force sensor 122 located between the element 210 and the substrate 208. The substrate 208 bends when the piezoelectric disk 206 contracts diametrically due to build up of charge at the piezoelectric disk 206 or in response to an external force applied to the touch-sensitive display 118. The charge may be adjusted by varying the applied voltage or current, thereby controlling the force applied by the piezo actuators 120 on the touch-sensitive display 118. The charge on the piezo actuators 120 may be removed by a controlled discharge current that causes the piezoelectric disk 206 to expand diametrically, decreasing the force applied by the piezo actuators 120 on the touch-sensitive display 118. Absent an external force applied to the overlay 114 and absent a charge on the piezoelectric disk 206, the piezo actuator 120 may be slightly bent due to a mechanical preload.

Figure 3:
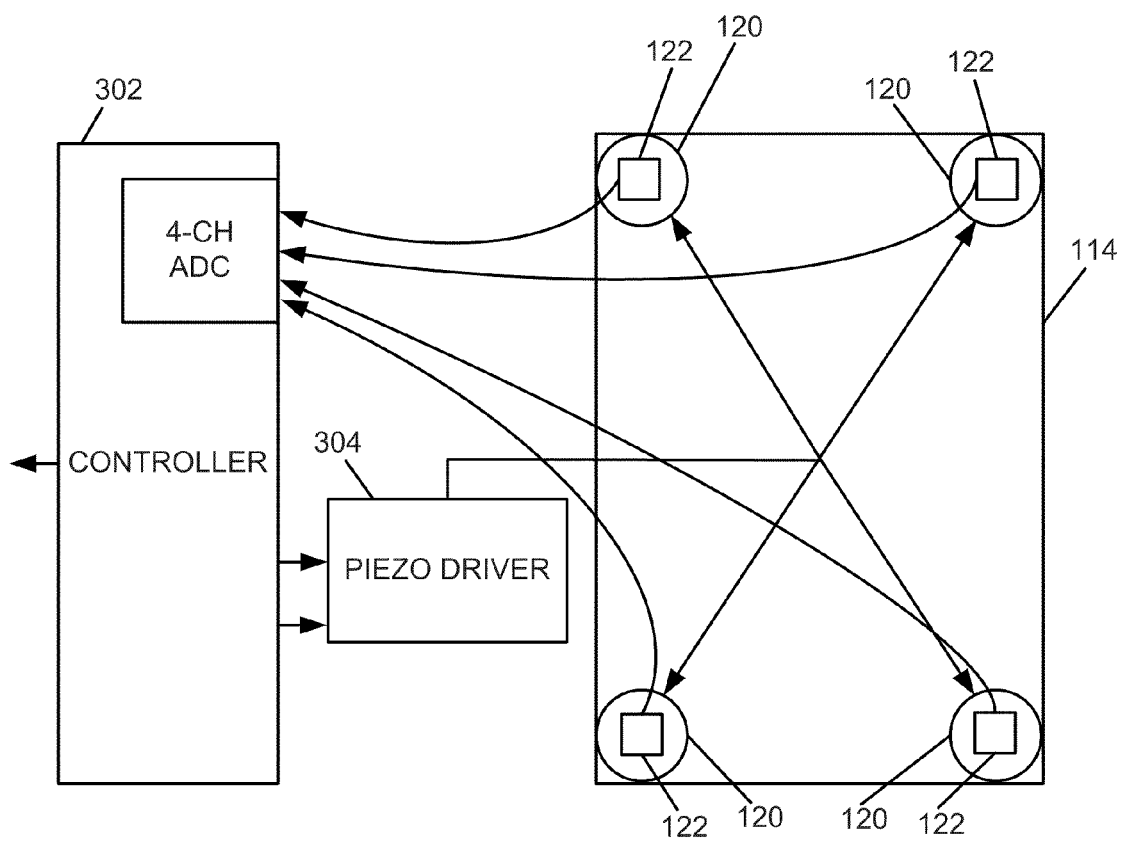
FIG. 3 is a functional block diagram showing components of the portable electronic device in accordance with the present disclosure.

FIG. 3 shows a functional block diagram of components of the portable electronic device 100. In this example, each force sensor 122 is connected to a controller 302, which includes an amplifier and analog-to-digital converter (ADC). The force sensors 122 may be force-sensing resistors in an electrical circuit, where resistance changes in response to the force applied. As applied force on the touch-sensitive display 118 increases, the resistance decreases. This change is determined via the controller 116 for each of the force sensors 122. The applied force of a touch is determined based on a value of force at each of the force sensors 122.

The piezo actuators 120 are connected to a piezo driver 304 that communicates with the controller 302. The controller 302 is also in communication with the main processor 102 of the portable electronic device 10 and may receive and provide signals to the main processor 102. The controller 302 controls the piezo driver 304 that controls the voltage to the piezoelectric disks 206 and thus controls the charge and the force applied by the piezo actuators 120 on the touch-sensitive display 118. Each of the piezoelectric disks 206 may be controlled substantially equally and concurrently. Optionally, the piezoelectric disks 206 may be controlled separately. When an applied force, on the touch-sensitive display 118, exceeds a first threshold, the charge at the piezo actuators 120 may be modulated to impart a force on the touch-sensitive display to simulate collapse of a dome switch. When the applied force, on the touch-sensitive display 118 falls below a second threshold, after actuation of the piezo actuators 120, the charge at the piezo actuators 120 may be modulated to impart a force, by the piezo actuators 120 on the touch-sensitive display 118, to simulate release of a dome switch. The second threshold is lower than the first threshold.

Figure 4:
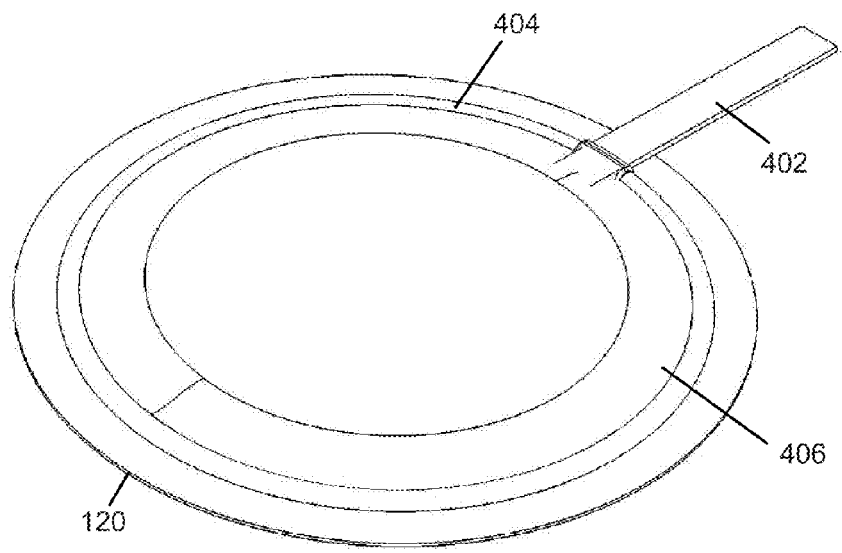
FIG. 4 is a perspective view of the actuator of in accordance with the present disclosure.
Figure 5:
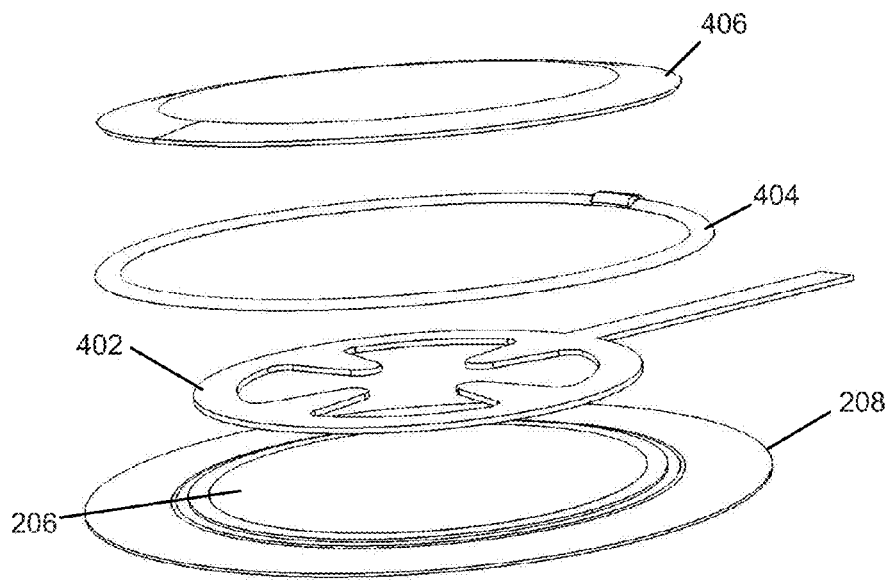
FIG. 5 is an exploded view of the actuator in accordance with the present disclosure.

A perspective view of a piezo actuator 120 is shown in FIG. 4 and an exploded view of the piezo actuator 120 is shown in FIG. 5. Each piezo actuator 120 is connected to the piezo driver 304 via a conductor 402, typically comprised of metal, such as a silver conductor deposited on each side of the piezoelectric disk 206. The piezo driver 304 applies voltage across the piezoelectric disk 206 to actuate the actuators 120 and modulate the force on the touch-sensitive display 118. A voltage of, for example, 150V may be applied across each piezoelectric disk 206. Metal migration, such as silver migration when a silver conductor is utilized, in the presence of an electric field, causes metal ions to move from the conductor 402 on one side of the piezoelectric disk 206, in the direction of increasing electrical potential. Microcracks that form during actuation of the piezoelectric disk 206 may join together to create larger cracks. When the cracks are large enough, the cracks facilitate migration of silver to another conductor (not shown) on the opposite side of the piezoelectric disk 206, between the piezoelectric disk 206 and the substrate 208, causing short circuiting of the piezoelectric disk 206. The movement of metal ions is influenced by the presence of moisture, for example, humidity in the air and is inhibited by the absence of moisture and the absence of movement of moisture.

To inhibit migration of metal such as silver from the conductor, a lip 404, which is raised, of polymeric material is applied to each piezo actuator 120, around the piezoelectric disk 206. The polymeric material may be, for example, a silicone-based material such as P/N 9186L. In the example shown in FIG. 4 and FIG. 5, the lip 404 is in the shape of a ring around the periphery of the piezoelectric disk 206. The lip 404 may be, for example in the range of about 200 μm to about 400 μm thick. A thin coating 406 of a second polymeric material, for example of silicone-based material such as 3-1953, covers the piezoelectric disk 206 and the metal conductor 402 within the ring formed by the lip 404. The thin coating may be, for example, in the range of about 100 μm to about 200 μm. The coating 406 is thin compared to the lip 404, and the elasticity of the coating 406 facilitates actuation of the piezo actuator 120. The coating 406 is less viscous than the lip 404 when applied to the piezo actuator 120 and, as a result, may flow upon application which may leave some areas of the piezo actuator 120 uncovered when the lip 404 is not used. The lip 404 acts as a dam in which the thin coating 406 is applied and facilitates coverage of the piezo actuator 120 within the lip 404. As described above, the piezo actuator 120 bends when an external force is applied to the touch-sensitive display 118. The lip 404 may be utilized as a stop to inhibit further bending of the piezo actuator 120.

Optionally, other materials may be utilized for the lip 404. For example, materials that repel water or seal out water such as acrylic, urethane, or fluorine-based materials may be utilized for the lip 404. Similarly, other materials may be utilized for the coating 406. For example, materials that repel water or seal out water such as acrylic, urethane, or fluorine-based materials may be utilized for the coating 406.

Figure 6:
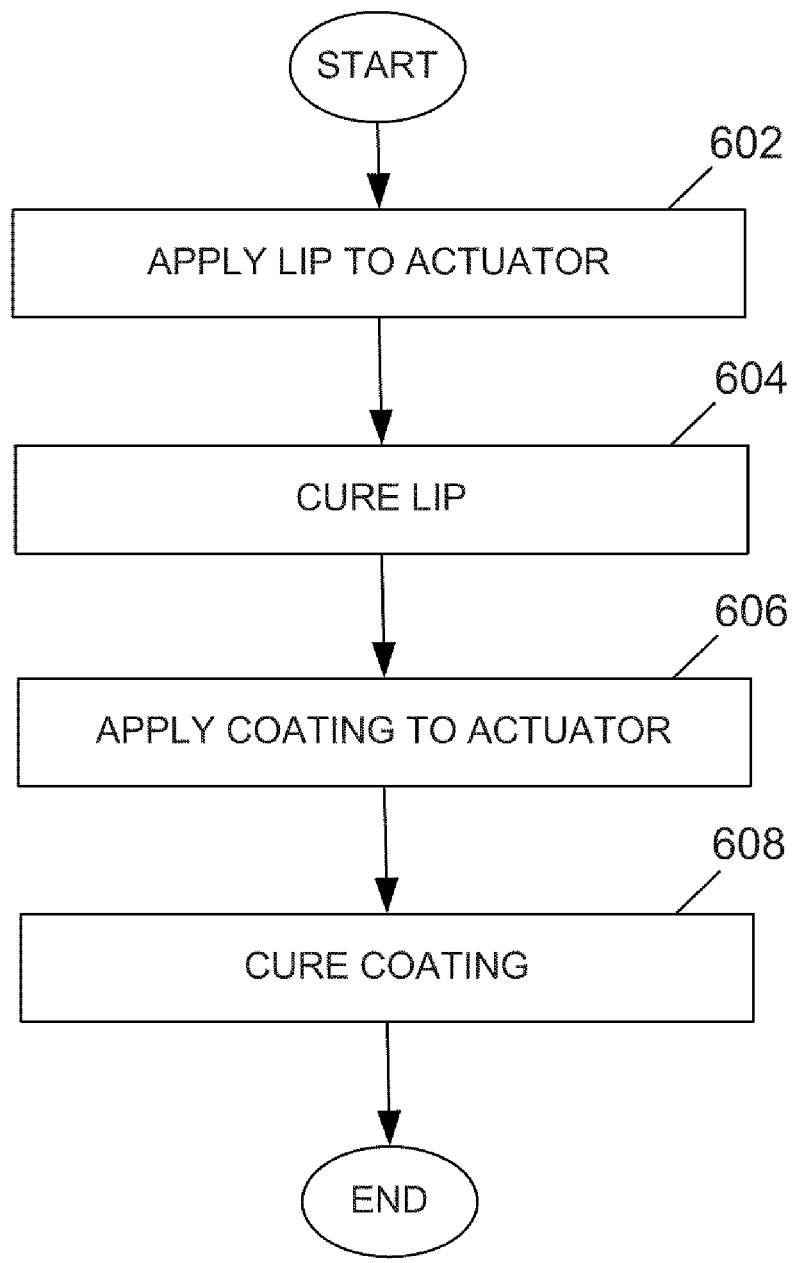
FIG. 6 is a flowchart illustrating a method of protecting the actuator in accordance with the present disclosure.

A flowchart illustrating one example of a method of protecting the piezo actuator 120 is shown in FIG. 6. The lip 404 is applied 602 to each piezo actuator 120 by a needle dispensing the polymeric material around the periphery of each piezoelectric disk 206. The polymeric material of the lip 404 is of suitable viscosity to form the lip 404 when applied to the piezo actuator 120. The lip 404 is air cured 606 for a suitable period of time to act as a dam within which the coating is applied. The coating 406 is sprayed 406 onto each piezo actuator 120, on the area of the piezo actuator 120 within the lip 404. The coating may be sprayed utilizing any suitable manual or automatic dispensing or spray coating machine. The coating is air cured 608.

The application of the lip 404 prior to application of the coating 406 facilitates formation of a coating that covers the surface area of the piezoelectric disk 206 within the lip 404. The coating 406 forms a seal over the side of the piezoelectric disk 206 and the conductor 402 to inhibit the migration of metal, such as silver ions, from the conductor 402 to increase the usable lifetime of each piezo actuator 120.

A method includes applying a lip, comprised of a first material, along at least a portion of an actuator of an electronic device, and applying a coating, comprised of an elastic material, to cover a part of the actuator, the coating disposed to facilitate actuation of the actuator.

An electronic device includes an actuator, a lip, comprised of a first material, along at least a portion of the actuator; and a coating, comprised of an elastic material on a part of the actuator, the coating disposed to facilitate actuation of the actuator.

The present disclosure may be embodied in other specific forms without departing from its spirit or essential characteristics. The described embodiments are to be considered in all respects only as illustrative and not restrictive. The scope of the present disclosure is, therefore, indicated by the appended claims rather than by the foregoing description. All changes that come within the meaning and range of equivalency of the claims are to be embraced within their scope.

What is claimed is:

1. A method comprising:
    applying a lip, comprising a first material, disposed along at least a portion of an outer edge of an actuator of an electronic device; and
    applying a coating, comprising an elastic material, to cover a part of the actuator, the coating disposed to facilitate actuation of the actuator and to inhibit migration of metal from a conductor coupled to the actuator.

2. The method according to claim 1, wherein the lip is disposed along an outer edge of the actuator.

3. The method according to claim 1, wherein the coating comprises a second material that covers a silver electrode on the actuator.

4. The method according to claim 1, wherein the actuator comprises a piezoelectric actuator and the part of the actuator comprises a ceramic piezoelectric device.

5. The method according to claim 3, wherein the second material comprises a polymeric material.

6. The method according to claim 1, wherein the first material comprises a polymeric material.

7. The method according to claim 1, wherein the first material has a greater viscosity than the coating.

8. The method according to claim 3, wherein the second material comprises any one of a silicone-based material, an acrylic, a urethane, a fluorine-based material or a combination thereof.

9. The method according to claim 1, wherein the lip comprises any one of a silicone-based material, an acrylic, a urethane, a fluorine-based material or a combination thereof.

10. The method according to claim 1, wherein applying the lip comprises applying the lip by needle dispensing the first material around the actuator.

11. The method according to claim 1, wherein applying the coating comprises spraying the coating on the actuator.

12. The method according to claim 1, wherein the coating is thin compared to the lip.

13. An electronic device comprising
    an actuator;
    a lip, comprising a first material, disposed along at least a part of an edge of the actuator; and
    a coating, comprising an elastic material disposed on the portion of the actuator, arranged to facilitate actuation of the actuator and to inhibit migration of metal from a conductor coupled to the actuator.

14. The electronic device according to claim 13, wherein the lip is disposed along an outer edge of the actuator.

15. The electronic device according to claim 13, wherein the actuator comprises a piezoelectric actuator and the part of the actuator comprises a ceramic piezoelectric device.

16. The electronic device according to claim 13, wherein the coating comprises a second material that covers a silver electrode on the actuator.

17. The electronic device according to claim 14, wherein the second material comprises a polymeric material.

18. The electronic device according to claim 13, wherein the first material comprises a polymeric material.

19. The electronic device according to claim 13, wherein the first material has a greater viscosity than the coating.

20. The electronic device according to claim 14, wherein the second material comprises any one of a silicone-based material, an acrylic, a urethane, a fluorine-based material or a combination thereof.

21. The electronic device according to claim 13, wherein the lip comprises any one of a silicone-based material, an acrylic, a urethane, a fluorine-based material or a combination thereof.

22. The electronic device according to claim 13, wherein the coating is thin compared to the lip.

23. The electronic device according to claim 13, wherein the lip is arranged to limit bending of the actuator upon receipt of an external applied force.

* * * * *